US006457235B1

(12) United States Patent
Chuo et al.

(10) Patent No.: US 6,457,235 B1
(45) Date of Patent: Oct. 1, 2002

(54) METHOD OF WIRE-BONDING CIRCUIT CHIP TO BONDING PAD

(75) Inventors: Te-Tsung Chuo; Hui-Chin Fang, both of Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/590,288

(22) Filed: Jun. 9, 2000

(51) Int. Cl.[7] .................................................. H01R 9/00
(52) U.S. Cl. .............................. 29/843; 29/842; 228/1.1
(58) Field of Search ........................... 29/825, 842, 843, 29/844, 845, 846; 228/1.1

(56) References Cited

U.S. PATENT DOCUMENTS 4,950,866 A * 8/1990 Kojimqa et al.
5,205,463 A * 4/1993 Holdgrafer et al.
5,961,029 A * 10/1999 Nishiurta et al.
5,989,995 A * 11/1999 Nishiura et al.
6,112,974 A * 9/2000 Nishiura et al.

* cited by examiner

Primary Examiner—Carl J. Arbes
(74) Attorney, Agent, or Firm—Greenblum & Bernstein, P.L.C.

(57) ABSTRACT

An integrated circuit device includes a substrate with a contact unit, an integrated circuit chip with a bonding pad unit, and a bonding wire interconnecting the bonding pad unit and the contact unit. The bonding wire has a electrical bonding contact attached to the bonding pad unit, a first extension portion extending from the electrical bonding contact in a direction that inclines slightly and upwardly relative to a plane of the substrate toward the contact unit, and a second extension portion extending from the first extension portion and attached to the contact unit.

5 Claims, 6 Drawing Sheets

METHOD OF WIRE-BONDING CIRCUIT CHIP TO BONDING PAD

BACKGROUND OF THE INVENTION

1. Field of the Invention

This invention relates to an integrated circuit device and a wire-bonding method for bonding a bounding pad unit on an integrated circuit chip to a contact unit on a substrate, such as a lead frame or a printed circuit board.

2. Description of the Related Art

FIGS. 1 to 4 illustrate a conventional integrated circuit device and a wire-bonding method for forming the integrated circuit device via a wire bonder (not shown). The integrated circuit device includes a substrate 15 with a contact unit 321, an integrated circuit chip 31 with a bonding pad unit 311, and a bonding wire 14 attached to the bonding pad unit 311 and the contact unit 321. The wire bonder includes a capillary head 11 that feeds the bonding wire 14, and forms the bonding wire 14 with a solder ball 13 that is attache d to the bonding pad unit 12 during the wire bonding operation (see FIG. 2). The capillary head 11 then moves along a trajectory (see FIG. 4) such that the bonding wire 14 is configured to have a first extension section 32 that extends upwardly in a direction substantially perpendicular to a plane of the substrate 15, and a second extension section 33 that has a first segment 331 extending downwardly and curvedly from the first extension section 32, and a second segment 332 extending downwardly and inclinedly from the first segment 331 toward the contact unit 321 and attached to the contact unit 321 via stitch bonding (see FIG. 3). The trajectory of the capillary head 11 includes a first linear path 3A that extends upwardly from the solder ball 13 in a direction substantially perpendicular to the plane of the substrate 15, a second linear path 3B that extends from the first linear path 3A in a direction substantially parallel to the substrate 15 away from the contact unit 321, a third linear path 3C that extends upwardly from the second linear path 3B in a direction substantially perpendicular to the plane of the substrate 15, and a fourth path 3D that extends downwardly and curvedly from the third linear path 3C to the contact unit 321.

The whole configuration of the aforesaid bonding wire 14 permits the bonding wire 14 to possess a high wire strength. Moreover, the first extension section 32 extends upwardly from the solder ball 13 to a level that permits the second extension section 33 to be spaced apart from the integrated circuit chip 31 at a distance that is sufficient to prevent the bonding wire 14 from contacting the integrated circuit chip 31 when the bonding wire 14 is turned downwardly and inclinedly from the first extension section 32 toward the contact unit 321 during formation of the second extension section 33. However, such configuration of the bonding wire 14 is disadvantageous in that it is not feasible to attach two or more bonding wires, which are to be fed from the capillary head 11, to the solder ball 13 due to interference of the first extension section 32 with the capillary head 11. While, additional bonding wires can be attached to the bonding pad unit 311 at positions that are spaced apart from the solder ball 13 in order to avoid the aforesaid interference, such arrangement would enlarge the size of the bonding pad unit 311 and affect adversely design flexibility of an integrated circuit chip.

SUMMARY OF THE INVENTION

Therefore, the object of the present invention is to provide an integrated circuit device that includes one or more bonding wires attached to a contact unit on a substrate, such as a lead frame or a printed circuit board, and to a electrical bonding contact attached to a bonding pad unit on an integrated circuit chip.

Another object of the present invention is to provide a wire-bonding method that is suitable for attaching one or more bonding wires to a contact unit on a substrate, such as a lead frame or a printed circuit board, and to a electrical bonding contact attached to a bonding pad unit on an integrated circuit chip.

According to one aspect of the present invention, an integrated circuit device comprises: a substrate having a top side provided with a contact unit; an integrated circuit chip mounted on the substrate and having a top side formed with a bonding pad unit; and a bonding wire interconnecting the bonding pad unit and the contact unit, and having a electrical bonding contact attached to the bonding pad unit, a first extension portion extending from the electrical bonding contact in a direction that inclines slightly and upwardly relative to a plane of the substrate toward the contact unit, and a second extension portion extending from the first extension portion and attached to the contact unit.

According to another aspect of the present invention, a wire-bonding method for bonding a bonding pad unit on an integrated circuit chip to a contact unit on a substrate via a wire bonder that includes a capillary head, comprises the steps of: feeding a bonding wire via the capillary head; forming the bonding wire with a electrical bonding contact that is attached to the bonding pad unit; moving the capillary head along a trajectory such that the bonding wire has a first extension portion extending from the electrical bonding contact in a direction that inclines slightly and upwardly relative to a plane of the substrate toward the contact unit, and a second extension portion extending from the first extension portion toward the contact unit; and attaching the second extension portion to the contact unit.

BRIEF DESCRIPTION OF THE DRAWINGS

In drawings which illustrate embodiments of the invention.

DETAILED DESCRIPTION OF THE PREFERRED EMBODIMENTS

Figure 1:
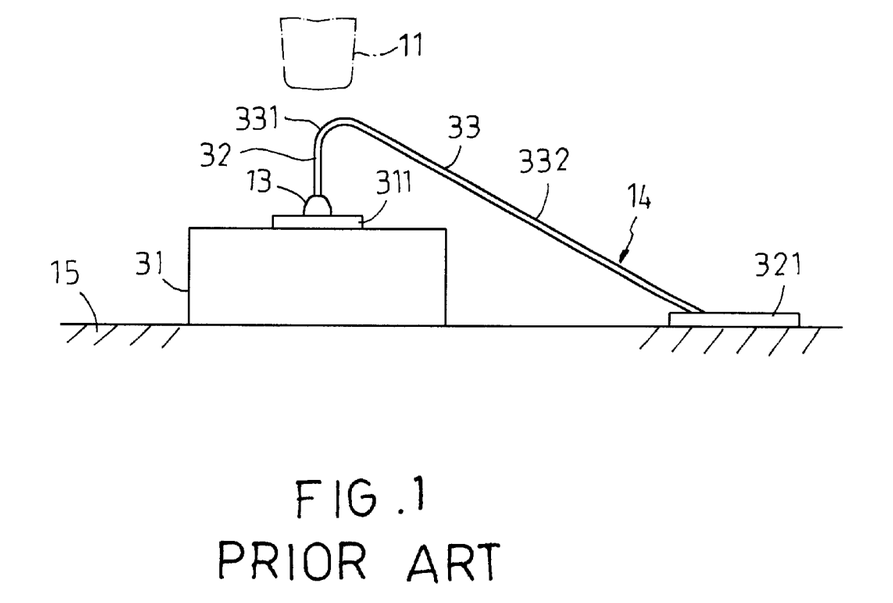
FIG. 1 is a schematic side view of a conventional integrated circuit device.
Figure 2:
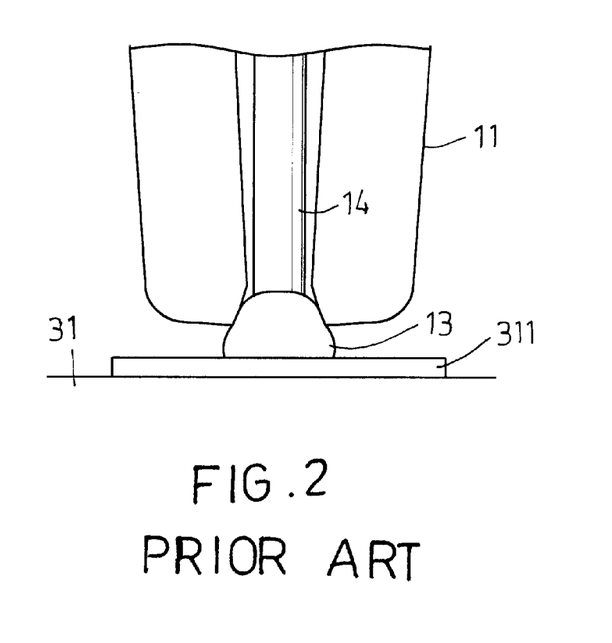
FIG. 2 is a schematic side view to illustrate how a solder ball is formed and is attached to a bonding pad of the conventional integrated circuit device of FIG. 1 via a capillary head of a wire bonder.
Figure 3:
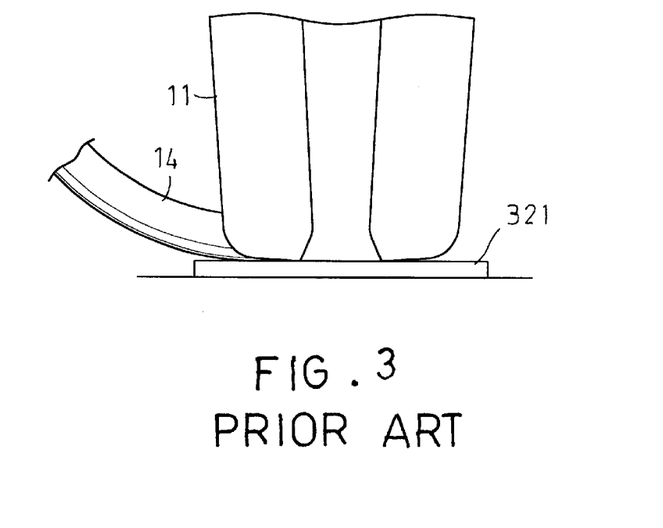
FIG. 3 is a schematic side view to illustrate how a bonding wire fed by the capillary head is attached to a contact unit of the conventional integrated circuit device of FIG. 1.
Figure 4:
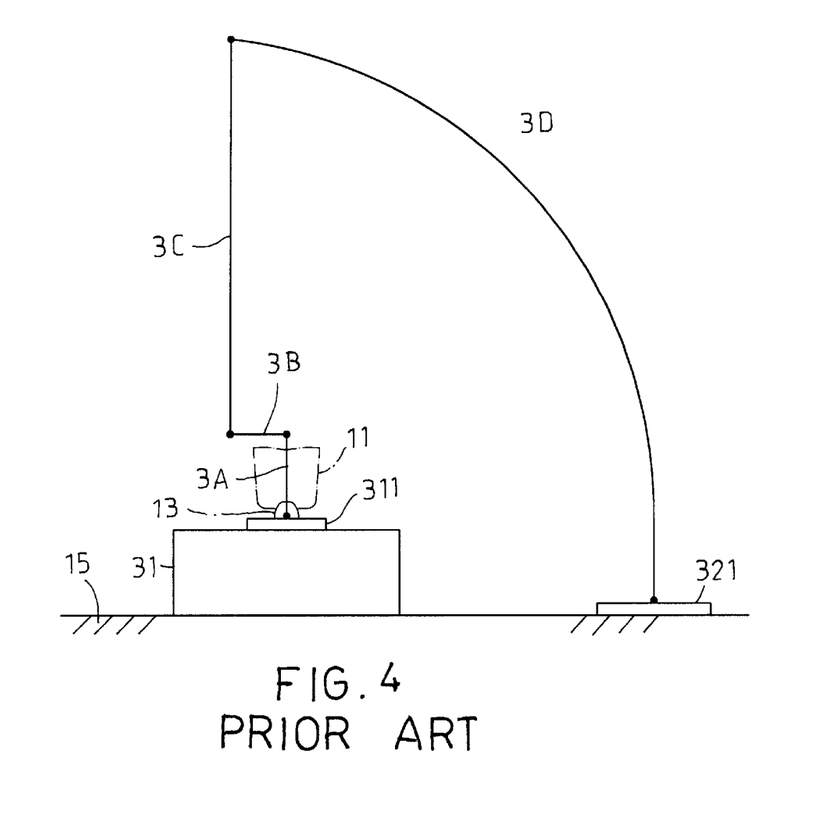
FIG. 4 is a schematic side view to illustrate a moving trajectory of the capillary head for performing wire-bonding in the conventional integrated circuit device.
Figure 5:
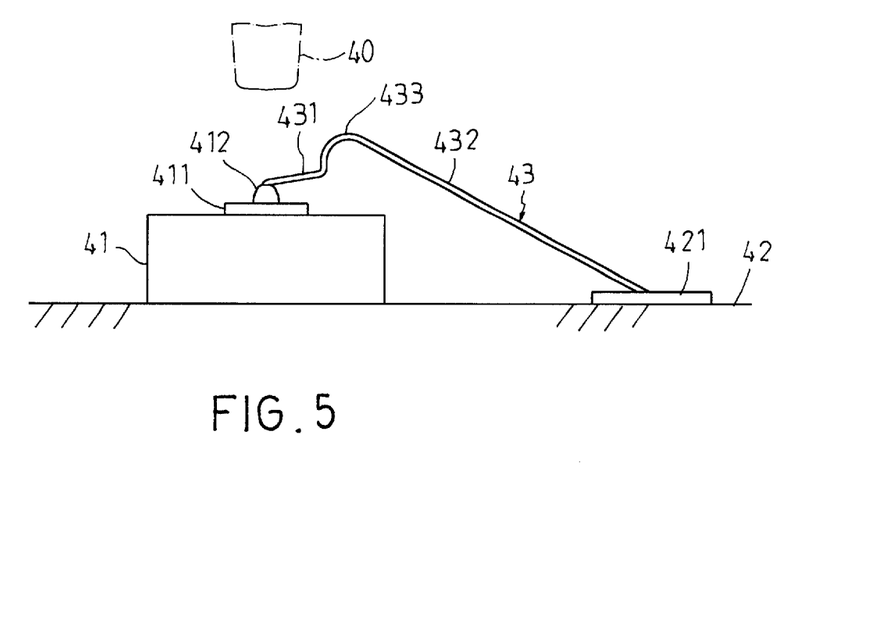
FIG. 5 is a schematic side view of a first embodiment of an integrated circuit device of this invention.

FIG. 5 illustrate s a first embodiment of an integrated circuit device of this invention. The integrated circuit device includes a substrate 42 having a top side provided with a contact unit 421, an integrated circuit chip 41 mounted on the substrate 42 and having a top side formed with a bonding pad unit 411, and a bonding wire 43 interconnecting the bonding pad unit 411 and the contact unit 421, and having a electrical bonding contact 412 attached to the bonding pad unit 411, a first extension portion 431 extending from the electrical bonding contact 412 in a direction that inclines slightly and upwardly relative to the plane of the substrate 42 toward the contact unit 421 and having a length that is greater than the radius of the capillary head 40, and a second extension portion 432 extending from the first extension portion 431 and attached to the contact unit 421. The second extension portion 432 has a curved segment 433 that curves upwardly from the first extension portion 431 and then turns downwardly toward the contact unit 421.

Figure 6:
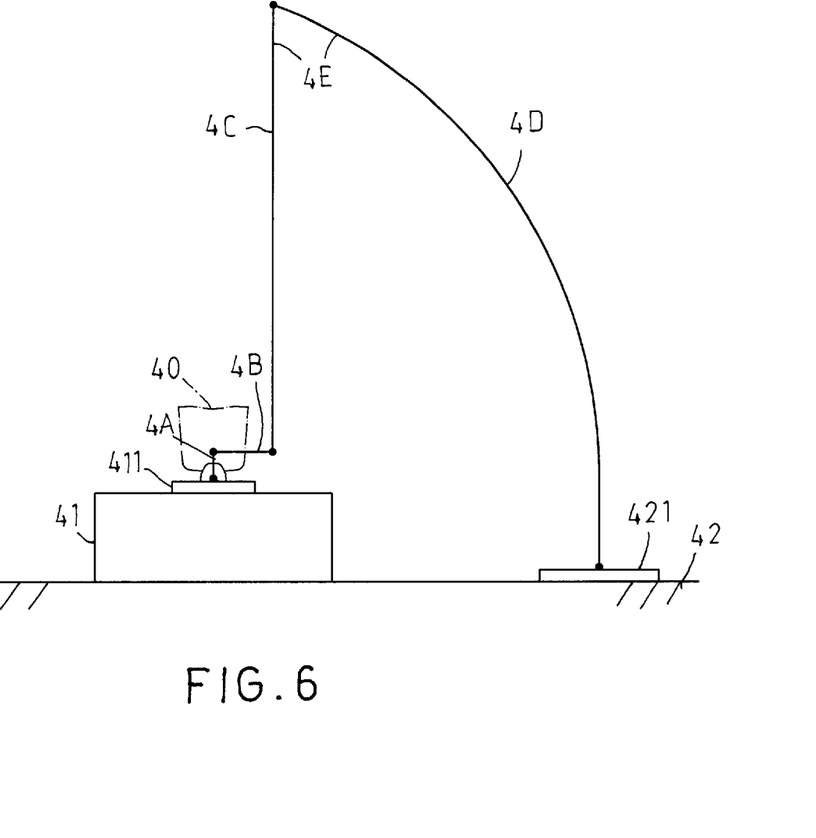
FIG. 6 is a schematic side view to illustrate a first moving trajectory of the capillary head for forming a bonding wire of the integrated circuit device of FIG. 5.

Referring now to FIG. 6, in combination with FIG. 5, the integrated circuit device of FIG. 5 is produced by a wire-bonding method that utilizes a wire bonder (not shown) to form the bonding wire 43 and to connect the bonding wire 43 to the bonding pad unit 411 and the contact unit 421. The wire-bonding method includes the steps of feeding the bonding wire 43 via a capillary head 40 mounted on the wire bonder, forming the bonding wire 43 with the electrical bonding contact 412 so as to attach the bonding wire 43 to the bonding pad unit 411, moving the capillary head 40 along a first trajectory to give the bonding wire 43 a configuration as shown in FIG. 5, and attaching the bonding wire 43 to the contact unit 421 via stitching bonding. The first trajectory of the capillary head 40 includes a first linear path 4A that extends upwardly from the electrical bonding contact 412 in a direction substantially perpendicular to the plane of the substrate 42 and that has a length sufficiently small to permit movement of the capillary head 40 without uprooting the electrical bonding contact 412 from the bonding pad unit 411, a second linear path 4B that extends from the first linear path 4A in a direction substantially parallel to the plane of the substrate 42 toward the contact unit 421 and that has a distance sufficient to form the first extension portion 431 with a length that is greater than the radius of the capillary head 40, and a third path 4E which has a first section 4C that extends upwardly from the second linear path 4B, and a second section 4D that extends downwardly and curvedly from the first section 4C to the contact unit 421.

Figure 7:
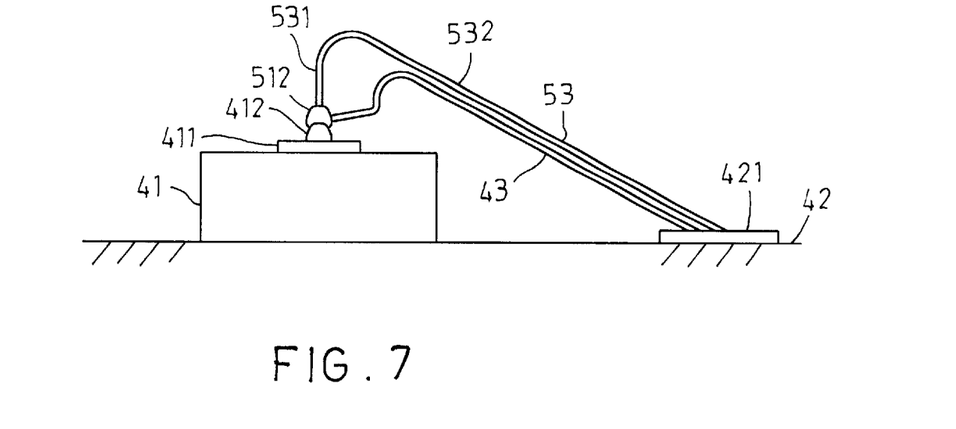
FIG. 7 is a schematic side view of a second embodiment of this invention to illustrate an additional bonding wire that has a first extension section attached to a first electrical bonding contact and a second extension section attached to a contact unit of the integrated circuit device of FIG. 5.

FIG. 7 illustrates a second embodiment of the integrated circuit device of this invention. Unlike the previous embodiment, an additional second bonding wire 53 is disposed above the bonding wire 43, and has two opposite ends which are respectively attached to the electrical bonding contact 412 and the contact unit 421. One of the opposite ends of the second bonding wire 53 is formed with a second electrical bonding contact 512 attached to the electrical bonding contact 412. The other one of the opposite ends of the second bonding wire 53 is attached to the contact unit 421 via stitching bonding. The second bonding wire 53 has a first extension section 531 extending upwardly from the second electrical bonding contact 512 in a direction substantially perpendicular to the plane of the substrate 42, and a second extension section 532 extending downwardly and inclinedly from the first extension section 531 toward the contact unit 421 and attached to the contact unit 421.

Figure 8:
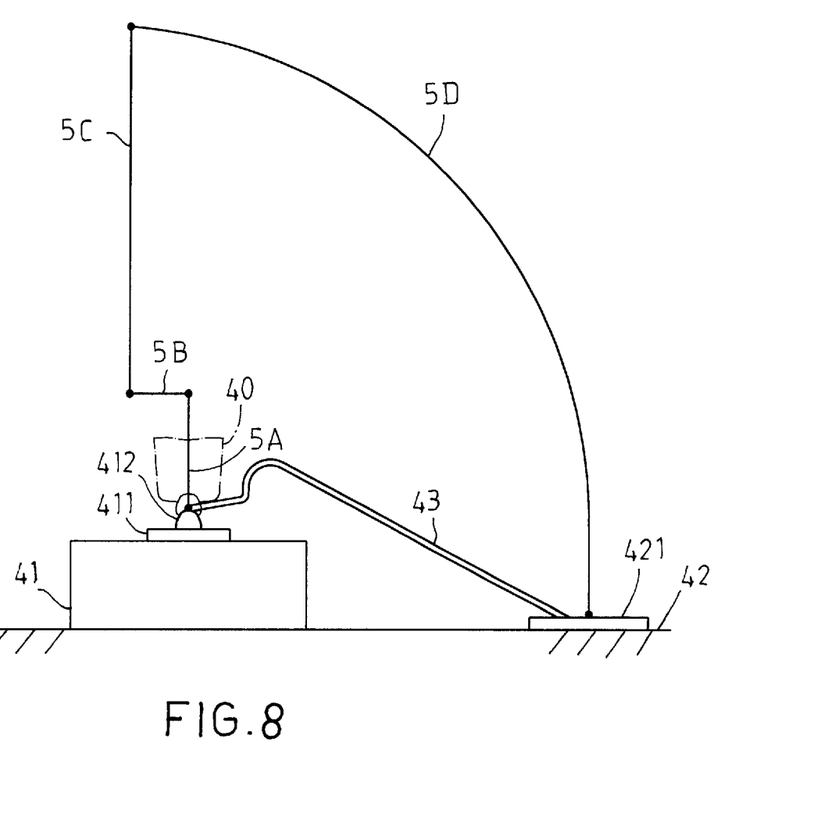
FIG. 8 is a schematic side view to illustrate a second moving trajectory of the capillary head for forming the additional bonding wire of FIG. 7.

Referring now to FIG. 8, in combination with FIG. 7, to form the second bonding wire 53, the capillary head 40 moves along a second trajectory that includes a first linear route 5A which extends upwardly from the second electrical bonding contact 512 in a direction substantially perpendicular to the plane of the substrate 42, a second linear route 5B which extends from the first linear route 5A in a direction substantially parallel to the plane of the substrate 42 away from the contact unit 421, a third linear route 5C which extends upwardly from the second linear route 5B, and a fourth route 5D which extends downwardly and curvedly from the third linear route 5C to the contact unit 421.

Figure 9:
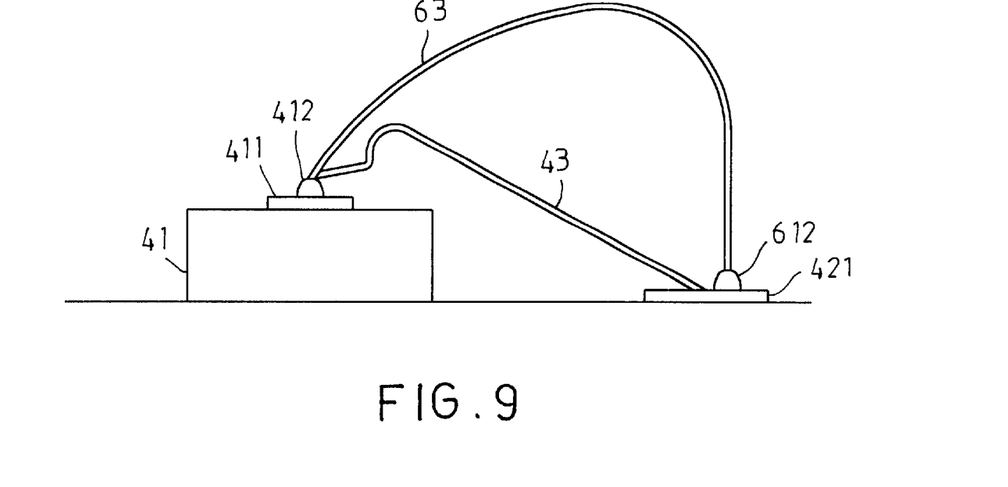
FIG. 9 is a schematic side view of a third embodiment of this invention to illustrate an additional bonding wire that has a first extension section attached to the contact unit and a second extension section attached to the first electrical bonding contact of the integrated circuit device of FIG. 5.

FIG. 9 illustrates a third embodiment of the integrated circuit device of this invention. Unlike the embodiment of FIG. 7, one of the opposite ends of the second bonding wire 63, which is formed with the second electrical bonding contact 612, is attached to the contact unit 421. The other one of the opposite ends of the second bonding wire 63 is attached to the electrical bonding contact 412 via stitch bonding.

Figure 10:
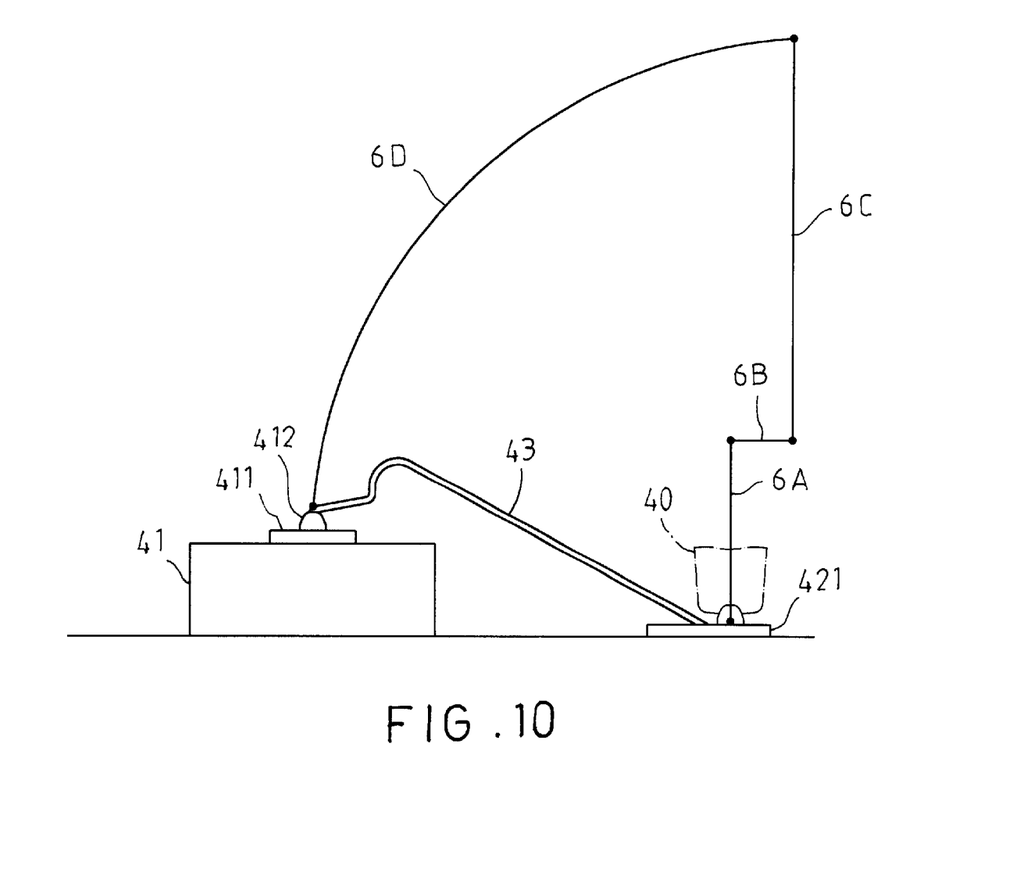
FIG. 10 is a schematic side view to illustrate a third moving trajectory of the capillary head for forming the additional bonding wire of FIG. 9.

Referring now to FIG. 10, in combination with FIG. 9, the second bonding wire 63 of this embodiment is formed in a manner opposite to that of the second bonding wire 53 of the previous embodiment, i.e., the capillary head 40 moves along a third trajectory that is opposite to the second trajectory. The third trajectory includes a first linear route 6A that extends upwardly from the second electrical bonding contact 612 in a direction perpendicular to the plane of the substrate 42, a second linear route 6B that extends from the first linear route 6A in a direction substantially parallel to the plane of the substrate 42 away from the bonding pad unit 411, a third linear route 6C that extends upwardly from the second linear route 6B, and a fourth route 6D that extends downwardly and curvedly from the third linear route 6C to the electrical bonding contact 412.

Figure 11:
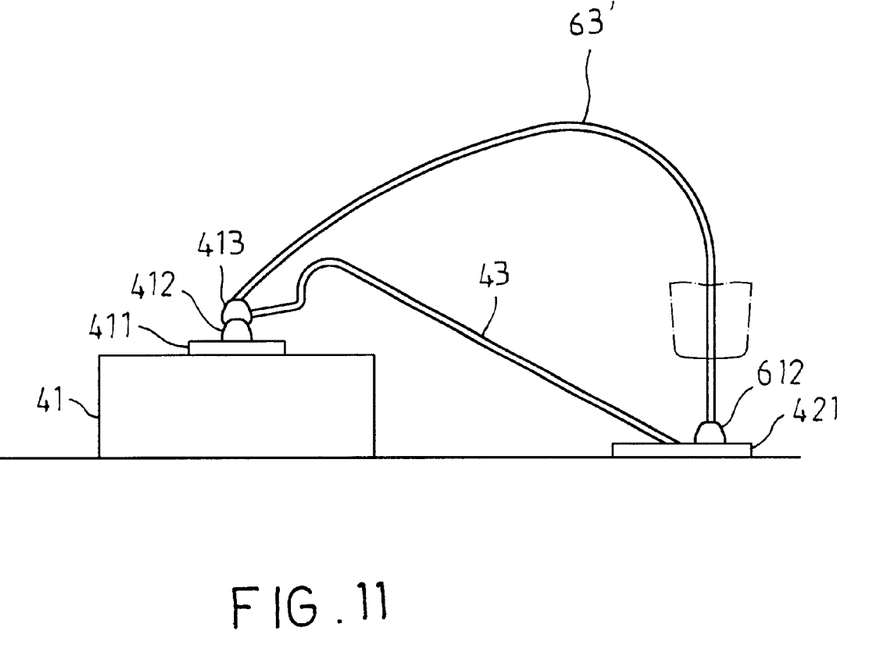
FIG. 11 is a schematic side view of a fourth embodiment of this invention to illustrate an additional bonding wire that has a first extension section attached to the contact unit and a second extension section attached to a second electrical bonding contact that is disposed on the first electrical bonding contact of the integrated circuit device of FIG. 5.

Referring now to FIG. 11, the integrated circuit device of this embodiment is generally the same as the previous embodiment shown in FIG. 9, except that the other one of the opposite ends of the second bonding wire 63 in this embodiment is attached to a third electrical bonding contact 413 which, in turn, is attached to the electrical bonding contact 412. The formation of the third electrical bonding contact 413 can avoid potential risk of damaging the bonding wire 43 during stitch bonding operation.

The configuration of the first extension portion 431 of the bonding wire 13 permits the capillary head 40 to have access to the electrical bonding contact 412 and to attach an additional bonding wire to the electrical bonding contact 412 without damaging the bonding wire 43, thereby overcoming the aforesaid problem associated with the prior art.

With the invention thus explained, it is apparent that various modifications and variations can be made without departing from the spirit of the present invention. It is therefore intended that the invention be limited only as recited in the appended claims.

We claim:

1. A wire-bonding method for electrically connecting a bonding pad unit on an integrated circuit chip to a contact unit on a substrate via a wire bonder, said method comprising:

feeding a bonding wire via a capillary head of the wire bonder;

forming an electrical bonding contact on the bonding pad unit;

moving the capillary head along a first trajectory that consists of a first linear path extending directly upwardly from the electrical bonding contact, a second linear path extending directly from the first linear path in a direction substantially parallel to the plane of the substrate and toward the contact unit, and a third path extending directly upwardly from the second linear path and then curvedly downwardly to the contact unit; and attaching the bonding wire to the contact unit on the substrate.

2. A wire-bonding method for electrically connecting a bonding pad unit on an integrated circuit chip to a contact unit on a substrate via a wire bonder, said method comprising:

feeding a bonding wire via a capillary head of the wire bonder;

forming an electrical bonding coact on the bonding pad unit;

moving the capillary head along a first trajectory that includes a first linear path extending directly upwardly from the electrical bonding contact, a second linear path extending directly from the first linear path in a direction substantially parallel to the plane of the substrate and toward the contact unit, and a third path extending from the second linear path to the contact unit;

attaching the bonding wire to the contact unit on the substrate;

feeding a second bonding wire via the capillary head and attaching the second bonding wire to the electrical bonding contact;

moving the capillary head along second trajectory that includes a first linear route extending directly upwardly from the electrical boding contact, a second linear route extending from the first linear route in a direction away from the contact unit, a third linear route extending upwardly from the second linear route, and a fourth route extending curvedly downwardly from the third linear route to the contact unit; and attaching the second bonding wire to the contact unit.

3. The wire-bonding method of claim 2, further comprising forming a second electrical bonding contact on the first electrical bonding contact before movement of the capillary head from the bonding pad unit on the contact unit along the second trajectory.

4. A wire-bonding method for electrically connecting a bonding pad unit on an integrated circuit chip to a contact unit on a substrate via a wire bonder, said method comprising:

feeding a bonding wire via a capillary head of the wire bonder;

forming an electrical bonding contact on the bonding pad unit;

moving the capillary head along a first trajectory that includes a first linear path extending directly upwardly from the electrical bonding contact, a second linear path extending directly from the first linear path in a direction substantially parallel to the plane of the substrate and toward the contact unit and a third path extending from the second linear path to the contact unit;

attaching the bonding wire to the contact unit on the substrate;

feeding a second bonding wire via the capillary head;

forming a second electrical bonding contact on the contact unit;

moving the capillary head along another trajectory that includes a first linear route extending directly upwardly from the second electrical boding contact, a second linear route extending from the first linear route in a direction away from the bonding pad unit, a third linear route extending upwardly from the second linear route, and a fourth route extending curvedly downwardly from the third linear route to the first electrical bonding contact; and attaching the second bonding wire to the first electrical bonding contact.

5. The wire-bonding method of claim 4, further comprising forming another electrical bonding contact on the first electrical bonding contact before movement of the capillary head from the contact unit to the bonding pad unit along said another trajectory.

* * * * *

UNITED STATES PATENT AND TRADEMARK OFFICE
CERTIFICATE OF CORRECTION

PATENT NO.    : 6,457,235 B1
DATED         : October 1, 2002
INVENTOR(S)   : T. Chuo et al.

It is certified that error appears in the above-identified patent and that said Letters Patent is hereby corrected as shown below:

Column 5,
Line 31, "coact" should be -- contact --.
Line 47, after "along" insert -- a --.
Line 49, "boding" should be -- bonding --.

Column 6,
Line 9, "on" should be -- to --.
Line 24, after "unit" insert -- , --.
Line 35, "boding" should be -- bonding --.

Signed and Sealed this

Seventeenth Day of June, 2003

JAMES E. ROGAN
*Director of the United States Patent and Trademark Office*